(12) United States Patent
Kim

(10) Patent No.: US 7,605,536 B2
(45) Date of Patent: Oct. 20, 2009

(54) LIGHT EMITTING DEVICE AND LIGHT EMITTING DISPLAY

(75) Inventor: Honggyu Kim, Uiwang-si (KR)

(73) Assignee: LG Display Co., Ltd., Seoul (KR)

( * ) Notice: Subject to any disclaimer, the term of this patent is extended or adjusted under 35 U.S.C. 154(b) by 376 days.

(21) Appl. No.: 11/431,190

(22) Filed: May 10, 2006

(65) Prior Publication Data
US 2006/0255726 A1 Nov. 16, 2006

(30) Foreign Application Priority Data
May 11, 2005 (KR) .............. 10-2005-0039278
Apr. 12, 2006 (KR) .............. 10-2006-0033372

(51) Int. Cl.
*H05B 33/26* (2006.01)
(52) U.S. Cl. .................. 313/506; 313/503; 313/504
(58) Field of Classification Search ............... None
See application file for complete search history.

(56) References Cited

U.S. PATENT DOCUMENTS 7,064,482 B2 * 6/2006 Park ................. 313/504
7,224,115 B2 * 5/2007 Sato et al. ............ 313/504
2002/0011783 A1 1/2002 Hosokawa ........... 313/504

FOREIGN PATENT DOCUMENTS

| CN | 1580278 | 2/2005 |
|---|---|---|
| JP | 2002-318553 | 10/2002 |
| JP | 2005-031645 | 2/2005 |

* cited by examiner

*Primary Examiner*—Ashok Patel
(74) *Attorney, Agent, or Firm*—Morgan Lewis & Bockius LLP

(57) ABSTRACT

The present invention provides a light emitting device comprising a substrate comprising a thin film transistor, a first electrode formed on the substrate and electrically connected to the thin film transistor, a light emitting part formed on the first electrode;
a second electrode formed on the light emitting part, and an auxiliary common electrode formed on a partial area of the second electrode, the partial area including a part of a non-emitting area.

9 Claims, 10 Drawing Sheets

LIGHT EMITTING DEVICE AND LIGHT EMITTING DISPLAY

This Non-provisional application claims priority under 35 U.S.C. §119(a) on Patent Application Ser. No. 10-2005-0039278 filed in Korea on May 11, 2005 and No. 10-2006-0033372 filed in Korea on Apr. 12, 2006 the entire contents of which are hereby incorporated by reference.

BACKGROUND OF THE INVENTION

1. Field of the Invention

The present invention relates to a light emitting device and a manufacturing method thereof, and a light emitting display and a manufacturing method thereof.

2. Description of the Related Art

In general, a light emitting device is a device that can actively emit light from an emitting part formed between two electrodes on a substrate. A light emitting device can be classified by driving method into active matrix type, in which the emitting part is driven by a thin film transistor (hereinafter, "TFT"), and passive matrix type, in which the emitting unit is driven by other means. A light emitting device can further be classified by direction of emission into bottom-emission type, in which light is emitted toward the substrate, and top-emission type, in which light is emitted toward opposite direction of the substrate. On the other hand, a light emitting device can be classified by the emitting materials used into organic light emitting type that comprises an organic luminescence layer, and an inorganic type that comprises an inorganic luminescence layer.

For example, pixel part of a top mission type active matrix organic light emitting diode (hereinafter, AMOLED) comprises switching thin film transistors (hereinafter, TFTs) for switching the pixels, driving transistors, storage capacitors, anodes, organic material layers, and common electrodes (cathodes).

FIG. 1 is a sectional view of a pixel on the axis of a thin film driving transistor in a conventional organic light emitting device.

Referring to FIG. 1, a conventional organic light emitting device comprised an organic light emitting layer 12 to be formed in a plurality of pixels that are defined by cross-areas of pixel electrodes 8, cathodes (metal electrode) 15, and transparent cathodes 16, each of which are formed in plurality on a glass substrate 1; a TFT A formed on the glass substrate 1, while drain terminal thereof is electrically connected to the pixel electrodes 8; a hole injection layer (hereinafter, hole injection layer) 10 as well as a hole transfer layer (hereinafter, hole transport layer) 11, both formed in layers between the pixel electrode 8 and the organic light emitting layer 12; and an electron transfer layer (hereinafter, electron transport layer) 13 as well as an electron injection layer (hereinafter, electron injection layer) 14, both formed in layers between the organic light emitting layer 12 and a metal common electrode 15.

The TFT A comprised a semiconductor layer 2 which is formed on an area of glass substrate 1 and is consisted of source/drain areas 2a, 2b and channel area 2c; a gate insulation film 3 formed on the whole area of glass substrate 1 including a semiconductor layer 2; and a gate electrode 4 formed on the gate insulation film 3 over the channel area 2c.

Here, boundary between the source/drain areas 2a, 2b and the channel area 2c was aligned to positive edge of the gate electrode 4.

In addition, an inter-layer insulation film 5 was formed on the TFT A for opening source area 2a and drain area 2b, to allow electrode lines 6 to be connected electrically to the source/drain areas 2a, 2b through openings of the inter-layer insulation film 5.

Further, a leveling insulation film 7 for opening the electrode lines 6 which is electrically connected to drain area 2b, was formed at front surface of the inter-layer insulation film 5 inclusive of the electrode lines 6.

On the leveling insulation film 7, a pixel electrode 8 was formed which is electrically connected to drain area 2b of the TFT A through openings of the leveling insulation film 7.

An insulation film 9 was formed for burying a part of pixel electrode 8 between the neighboring pixel electrodes 8.

An hole injection layer 10, a hole sport layer 11, an organic light emitting layer 12 of any one of R, G, B, an electron transport layer 13, and an electron injection layer 14 were formed successively on the pixel electrode 8.

The common electrodes 15, 16 are consisted of metal common electrode 15 and transparent common electrode 16, both formed on the electron injection layer 14, whereby a protective film 17 was formed on the transparent common electrode 16.

A description of the manufacturing process of a conventional light emitting device is given below making reference to FIG. 2.

FIGS. 2a to 2d show process of manufacturing a conventional light emitting device.

Referring to FIG. 2a, a semiconductor layer 2 to be used as an activation layer for TFT was formed on a glass substrate 1 utilizing a polycrystalline silicone, etc., and then, the semiconductor layer 2 is patterned in a manner that only the area designed for the TFT remains.

Then, a gate electrode 4 was formed by pattering conductive film of the gate electrode in a manner that the conductive film remains on an area of the patterned semiconductor layer 2, after a gate insulation film 3 and a conductive film of the gate electrode have been formed successively in layers.

The source/drain areas 2a, 2b of TFT were formed by injecting dopants such as B, P, etc. into semiconductor layer 2, and masking the same with gate electrode 4 successively, and then, heat-treating the same, whereby semiconductor 2 with no injected dopant was in channel area 2c.

After that, an inter-layer insulation film 5 was formed at front surface, and contact holes were formed by selectively removing the inter-layer insulation film 5 and the gate insulation film 3, so that the source/drain areas 2a, 2b of the TFT were exposed.

Then, a first metal film having a thickness to sufficiently bury the contact holes was formed, and electrode lines 6 to be connected electrically to the source/drain areas 2a, 2b were formed by selectively removing the first metal film such that the metal film remained only at contact holes and adjacent areas thereof.

Successively, the front surface was leveled by forming a leveling insulation film 7 at front surface, and contact holes were formed by selectively removing the leveling insulation film 7 such that electrode lines 6 connected to drain area 2b were exposed. After that, a second metal film made of metals with high reflexivity and work function such as Cr, Al, Mo, Ag, Au, etc. was added to the front surface.

Here, a second metal film was formed also in contact holes so that the metal film was connected to electrode lines 6 at bottom of the contact holes.

Then, pixel anode or pixel electrode 8 to be connected to lower drain area 2b through electrode line 6 was formed by selectively removing the second metal film such that the same remained only at pixel parts.

Referring to FIG. 2b, an insulation film 9 was formed to cover a part of the pixel electrodes 8 between the neighboring pixel electrodes 8.

Referring to FIG. 2c, a hole injection layer 10 and a hole transport layer 11 were deposited to as common organic layers, organic light emitting layers 12 for R, G, B are formed using shadow masks, and then, organic layers such as electron transport layer 13 and electron injection layer 14 were formed successively.

Referring to FIG. 2d, after the organic layers (10 to 14) have been formed, a metal common electrode 15 was formed thereon, whereby the metal common electrode 15 was made by addition of Al in a thickness of several nm and a successive addition of Ag in a thickness of several nm to several tens of nm, or of other metals such as $Mg_xAg_{1-x}$, etc. in a thickness of several nm to several tens of nm.

In addition, a transparent common electrode 16 was formed on the metal common electrode 15 using a transparent conductive material such as ITO, IZO, etc.

Finally, a protective film 17 for protection of the organic layers (10 to 14) from oxygen, humidity, etc. was formed and then installed using a sealant and a transparent substrate, with which step a top-emission type active matrix organic light emitting device was completed.

In a top-emission type active matrix organic light emitting device as above, light generated by recombination of holes and electrons at organic light emitting layers was emitted through metal cathode 5, in contrast to a bottom-emission type organic light emitting device, wherein light was emitted from bottom of the substrate. Accordingly, thickness of a metal film to be used as a metal common electrode 15 in such a bottom-emission type organic light emitting device could not be sufficiently thick and was limited generally to several nm to several tens of nm to secure a desirable transmission rate.

However, as a large amount of current flows continuously through the metal common electrode 15 in an organic light emitting device, a short by heat or oxidization could occur if the metal common electrode 15 was not sufficiently thick.

In particular, in cases where Ag was used for the metal common electrode 15, lumping could occur due to migration of Ag atoms, leading to reduced lifetime and decreasing of reliability of the product.

On the other hand, if thickness of the metal common electrode 15 was increased to 10 nm~15 nm, or even to 20 nm, to solve the above problems with lifetime shortening and reliability decrease, the transmission rate fell rapidly and the emitting efficiency was reduced substantially.

On the other hand, FIGS. 3 and 4 show an organic light emitting display which comprises a pad part formed with an organic light emitting device electrically connected to a wiring to drive the organic light emitting device.

FIG. 3 is a plane view of a conventional organic light emitting display, and FIG. 4 is a sectional view of the organic light emitting display shown in FIG. 3 taken along area X-X'.

Referring to FIG. 3, the conventional organic light emitting device 300 was formed with a pixel circuit part 308 on which a plurality of pixels (not shown) are positioned, and a wiring part 306 electrically connected to the pad part 304 to drive the organic light emitting device.

In addition, a cathode electrode 310, which is a common electrode for applying voltages to a ground power source, was formed on the wiring part 306 electrically connected to the pad part 304.

More specifically, the conventional organic light emitting device 400 as shown in FIG. 4, was formed with a gate insulation film 403 for insulating a gate electrode on the substrate 302, and a inter-layer insulation film 405 for opening a source area (not shown) and a drain area (not shown). In addition, on the upper side of the inter-layer insulation film 405 was formed a leveling insulation film 407 for leveling the upper surface of the inter-layer insulation film 405, and the wiring part 306 was formed so as to apply voltages to the ground power source to electrically connect the inter-layer insulation film 405 to the pad part 304 through a contact hole P1 of the leveling insulation film 407.

In addition, the cathode electrode 310 being a common electrode was formed to be electrically connected to the wiring part 306 exposed through the contact hole P1, and to cover a hole injection layer 411, a hole transport layer 413, a light emitting layer 414, an electron transport layer 415, and an electron injection layer 417.

Finally, a protective film 419 for preventing moisture and oxygen from being penetrated was formed on the upper side of the cathode electrode 310.

In the conventional organic light emitting display 300, 400 thusly constructed, a great amount of current flew continuously through the cathode electrode 310 being a common electrode electrically connected to the wiring part 306 due to the characteristic of the organic light emitting device. At this time, there occurred a problem that in a case where a great amount of current flew continuously through the cathode electrode 310 formed thin, the cathode electrode 310 became short or oxidized due to heat generated by the current. Accordingly, there occurred a problem that the lifetime of organic light emitting device is shorted, the trustworthy of organic light emitting device is dropped.

SUMMARY OF THE INVENTION

Accordingly, an aspect of the present invention is to solve at least the problems and disadvantages of the related art.

In accordance with one aspect of the present invention, a light emitting device comprises a substrate comprising a thin film transistor, a first electrode formed on the substrate and electrically connected to a thin film transistor, a light emitting part formed on the first electrode, a second electrode formed on the light emitting part and an auxiliary common electrode formed on a partial area of the second electrode, the partial area including a part of a non-emitting area.

In accordance with another aspect of the present invention, a method of manufacturing a light emitting device comprises preparing a substrate comprising a thin film transistor, forming on the substrate a first electrode electrically connected to the thin film transistor, forming a light emitting part on the first electrode, forming a second electrode on the light emitting part, and forming an auxiliary common electrode on a partial area of the second electrode, the partial area including apart of a non-emitting area.

At this time, the light emitting device further comprises an insulation film formed on the first electrode, a part of the insulation film being open between the first electrode and the light emitting part. On the other hand, the auxiliary common electrode may be formed on an upper side or lower side of the second electrode. In addition, the thickness of the second electrode may be less than the thickness of the auxiliary common electrode. In addition, the resistance of the auxiliary common electrode is less than the resistance of the second electrode. Meanwhile, the first electrode and the second electrode may be an anode electrode and a cathode common electrode, respectively.

In accordance with still another aspect of the present invention, a light emitting display comprises a substrate, a pixel circuit part comprising a light emitting part formed between a first electrode and a second electrode located on the substrate, a wiring part formed to be electrically connected to the second electrode, an insulation film formed on the wiring part and formed with a contact hole which is formed by exposing a part of the wiring part, the contact hole connecting electrically the second electrode and the wiring part, and an auxiliary common electrode formed on the second electrode, the auxiliary common electrode located on the same line as the contact hole.

In accordance with yet still another aspect of the present invention, an method of manufacturing a light emitting display comprises preparing a substrate, forming a pixel circuit part comprising a light emitting part formed between a first electrode and a second electrode located on the substrate, forming a wiring part to be electrically connected to the second electrode, forming an insulation film formed on the wiring part and formed with a contact hole which is formed by exposing a part of the wiring part, the contact hole connecting electrically the second electrode and the wiring part, and forming an auxiliary common electrode on the second electrode to be located on the same line as the contact hole.

In accordance with yet still another aspect of the present invention, a light emitting display comprises a substrate, a pixel circuit part comprising a light emitting part formed between a first electrode and a second electrode located on the substrate, a wiring part formed to be electrically connected to the second electrode, an insulation film formed on the wiring part and formed with one and more contact holes which are formed by exposing a part of the wiring part the contact hole connecting electrically the second electrode and the wiring part, and an auxiliary common electrode formed on the second electrode to correspond to one and more of the contact holes in a longitudinal direction of the wiring part.

In accordance with yet still another aspect of the present invention, a method of manufacturing a light emitting display comprises preparing a substrate, forming a pixel circuit part forming a pixel circuit part comprising a light emitting part formed between a first electrode and a second electrode located on the substrate, forming a wiring part to be electrically connected to the second electrode, forming an insulation film formed on the wiring part and formed with one and more contact holes which are formed by exposing a part of the wiring part, the contact hole connecting electrically the second electrode and the wiring part, and forming an auxiliary common electrode on the second electrode to correspond to one and more of the contact holes in a longitudinal direction of the wiring part.

BRIEF DESCRIPTION OF THE DRAWINGS

The invention will be descried in detail with reference to the following drawings in which like numerals refer to like elements.

DETAILED DESCRIPTION OF PREFERRED EMBODIMENTS

Preferred embodiments of the present invention will be described in a more detailed manner with reference to the drawings.

<1. Light Emitting Device>

Figure 5:
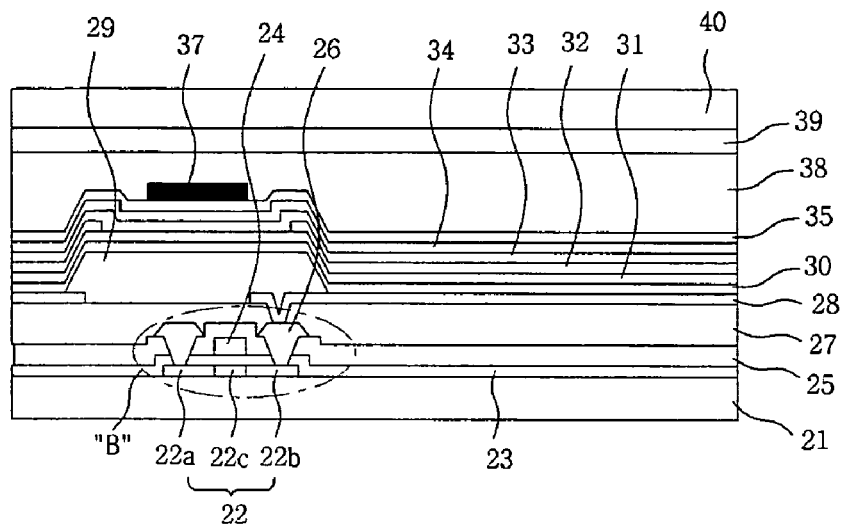
FIG. 5 is a sectional view of a light emitting device in accordance with an embodiment of the present invention.

FIG. 5 is a sectional view of a light emitting device in accordance with an embodiment of the present invention.

As shown in the drawing, a light emitting device in accordance with an embodiment of the present invention comprises a light emitting layer 32 to be formed in a plurality of pixels that are defined by the cross-areas of anodes 28 and cathodes 35, each of which is formed in plurality on a glass substrate 21; a TFT B formed on the glass substrate 21, while drain terminal thereof is electrically connected to the anodes 28; and an auxiliary common electrode 37 with a prescribed thickness which is formed on areas other than the pixel parts that are non-emitting areas inclusive of TFT B, and is electrically connected to the cathodes 35. The auxiliary common electrode 37 functions to prevent eventual heat shorts caused by a continuous flow of large amount of electric current through the cathode common electrode 35 as well as eventual oxidization of the cathode common electrode 35.

The TFT B comprises a semiconductor layer 32 which is formed on an area of the glass substrate 21 and is consisted of source/drain areas 22a, 22b and channel area 2c; a gate insulation film 23 formed on the whole area of the glass substrate 21 including the semiconductor layer 22; and a gate electrode 24 formed on the gate insulation film 23 over the channel area 22c.

Here, boundary between the source/drain areas 22a, 22b and the channel area 22c is aligned to positive edge of the gate electrode 24.

In addition, an inter-layer insulation film 25 is formed on the TFT B for opening source area 22a and drain area 22b, to allow the electrode lines 26 to be connected electrically to the source/drain areas 22a, 22b through openings of the inter-layer insulation film 25.

Further, a leveling insulation film 27 for opening the electrode lines 26 which is electrically connected to drain area 22b, is formed at front surface of the inter-layer insulation film 25 inclusive of the electrode lines 26.

On the leveling insulation film 27, an anode 28 is formed which is electrically connected to drain area 22b of the TFT B through openings of the leveling insulation film 27.

An insulation film 29 is formed on parts of the anode 28 and of the leveling insulation film 27. And a hole injection layer 30 and a hole transport layer 31 are formed successively in layers on the anode 28 and the insulation film 27, while emitting layers 32 of R, G, B are formed on pixel part of the hole transport layer 31.

electron transport layer 33 and electron injection layer 34 are formed on the R, G, B emitting layers 32 and the hole transport layer 31, whereby the insulation film 29 functions as insulation barrier between the R, G, B emitting layers 32 and the adjacent to other R, G, B emitting layers 32.

Further, a cathode common electrode 35 is formed on the electron injection layer 34, and an auxiliary common electrode 37 is formed in stripe form on non-emitting area of the cathode common electrode 35 other than the pixel area where light emitting layer 32 is formed.

Here, the cathode common electrode 35 is preferably made of Ag or $Mg_xAg_{1-x}$ in a thickness of 1 nm~5 nm, while the auxiliary common electrode 37 is preferably made of a material having a resistance lower than that of the cathode common electrode 35, such as Al, in a thickness larger than that of the cathode common electrode 35, preferably 8 nm~20 nm. By minimizing thickness of the cathode common electrode 35 as above, ray of light emitted from the emitting layer 32 can be transmitted to a direction opposite to the glass substrate 21, thus, this type of light emitting device is called a top-emission type light emitting device.

Since the auxiliary common electrode 37 is formed on non emitting area of the cathode common electrode 35 including the TFT B, opening ratio of the emitting area is not affected thereby, and thus, the transmission rate can be enhanced.

Furthermore, since the auxiliary common electrode 37 has a larger thickness and a lower resistance than the cathode common electrode 35, most of electric current of the cathode common electrode 35 is taken over by the auxiliary common electrode 37, so that heat shorts as well as lumps caused by migration of Ag atoms can be prevented As a result, forming the auxiliary common electrode 37 on the cathode common electrode 35 allows for lowering surface resistance.

Figure 6:
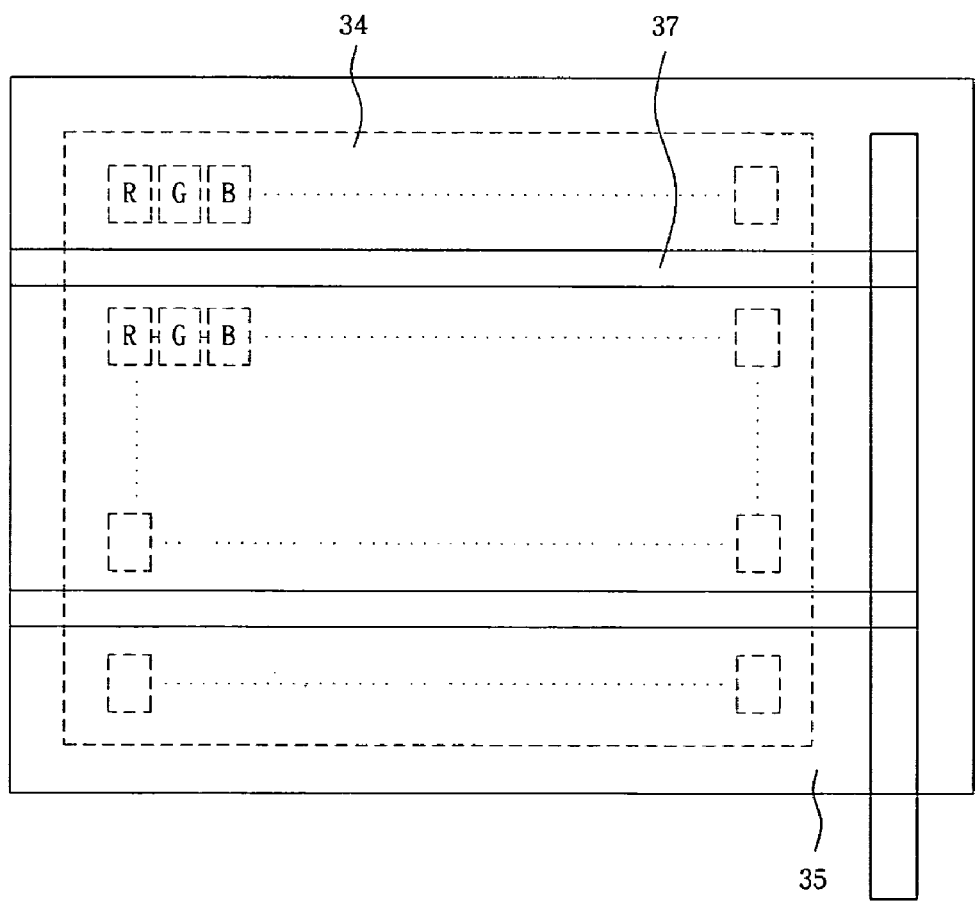
FIG. 6 is a plane view of a light emitting device in accordance with an embodiment of the present invention.

As shown in FIGS. 5 and 6, and more particularly in FIG. 6, in a light emitting device in accordance with an embodiment of the present invention, a cathode common electrode 35 is formed on a substrate 21 inclusive of R, G, B emitting parts (30 to 34), and an auxiliary common electrode 37 is formed in stripe form on non-emitting area of the cathode common electrode 35 other than the pixel area where light emitting layer 32 is formed. Accordingly, the auxiliary common electrode 37 does not affect opening ratio of the light emitting layer 32, and heat shorts as well as lumps caused by migration of Ag atoms can be prevented, as most of electric current of the cathode common electrode 35 is taken over by the auxiliary common electrode 37.

Here, the R, G, B emitting parts (30 to 34) comprise organic light emitting layers that emit light from organic materials as described above. However, the present invention is not limited thereto, but rather can comprise inorganic light emitting layers that emit light from inorganic materials, as well. If the R, G, B emitting parts (30 to 34) comprise organic light emitting layers, the light emitting device is called an organic light emitting device, and if these parts comprise inorganic light emitting layers, the light emitting device is called an inorganic light emitting device, or simply, a light emitting device.

A description of method of manufacturing a light emitting device in accordance with the present invention is given below, making reference to FIGS. 7a to 7f.

FIGS. 7a to 7f show the process of manufacturing a light emitting device in accordance with an embodiment of the present invention.

Figure 7A:
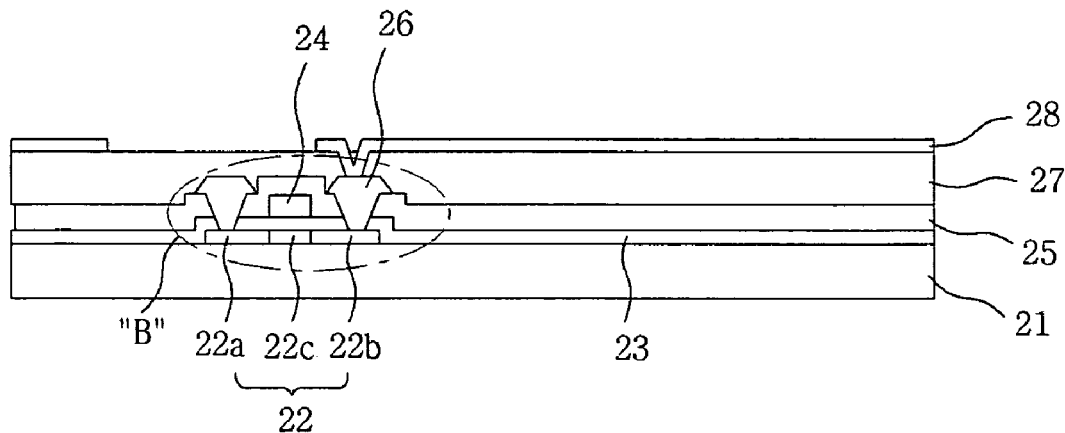
FIGS. 7a to 7f show the process of manufacturing a light emitting device in accordance with an embodiment of the present invention.

Referring to FIG. 7a, a semiconductor layer 22 to be used as an activation layer for TFT is formed on a glass substrate 21 utilizing a polycrystalline silicone, etc., and then, the semiconductor layer 22 is patterned in a manner that only the area designed for the TFT remains.

Then, a gate electrode 24 is formed by pattering material of the gate electrode in a manner that the material remains on an area of the patterned semiconductor layer 22, after a gate insulation film 23 and the material of gate electrode have been formed successively in layers.

The source/drain areas 22a, 22b of TFT are formed by injecting dopants such as P, B, etc. into semiconductor layer 22, and masking the same with gate electrode 24 successively, and then, heat-treating the same.

After that, an inter-layer insulation film 25 is formed at the front surface, and contact holes are formed by selectively removing the inter-layer insulation film 25 and the gate insulation film 23, so that the source/drain areas 22a, 22b of TFT B are exposed.

Then, a first metal film having a thickness to sufficiently bury the contact holes is formed, and electrode lines 26 to be connected electrically to the source/drain areas 22a, 22b are formed by selectively removing the first metal film such that the metal film remains only at contact holes and adjacent areas thereof.

Successively, the front surface is leveled by forming a leveling insulation film 27 at the front surface, and contacts holes are formed by selectively removing the leveling insulation film 27 such that electrode lines 26 connected to the drain area 22b are exposed. After that, a second metal film made of metals with a high reflexivity and work function such as Cr, Al, Mo, Ag, Au, etc. is added to the front surface.

Here, a second metal film is formed also in contact holes so that the metal film is connected to the electrode lines 26 at bottom of the contact holes.

Then, pixel anode or anode 28 is formed by selectively removing the second metal film such that the same remains only at pixel parts.

Figure 7B:
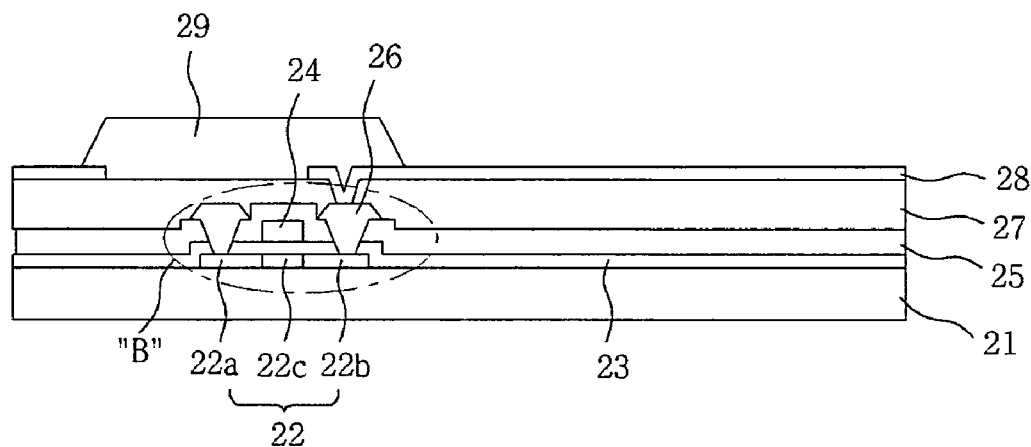

Referring to FIG. 7b, an insulation film 29 is formed to cover parts of the anodes 28 and the insulation film 27.

Figure 7C:
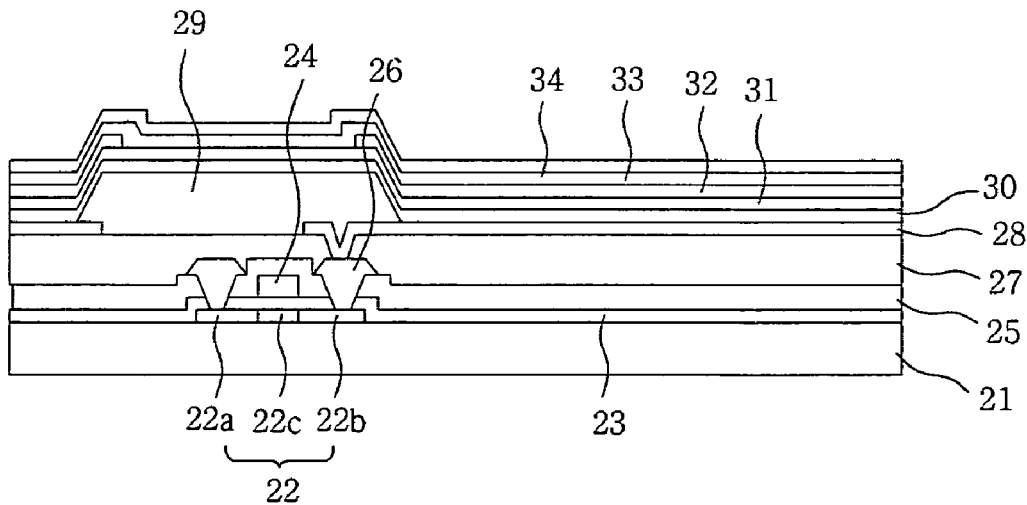

Referring to FIG. 7c, common organic layers are formed by adding a hole injection layer 30 and a hole transport layer 31 successively. Light emitting layers 32 for R, G, B are formed using shadow masks, and then, light emitting parts (30 to 34) are generated by forming electron transport layer 33 and electron injection layer 34 thereon.

Figure 7D:
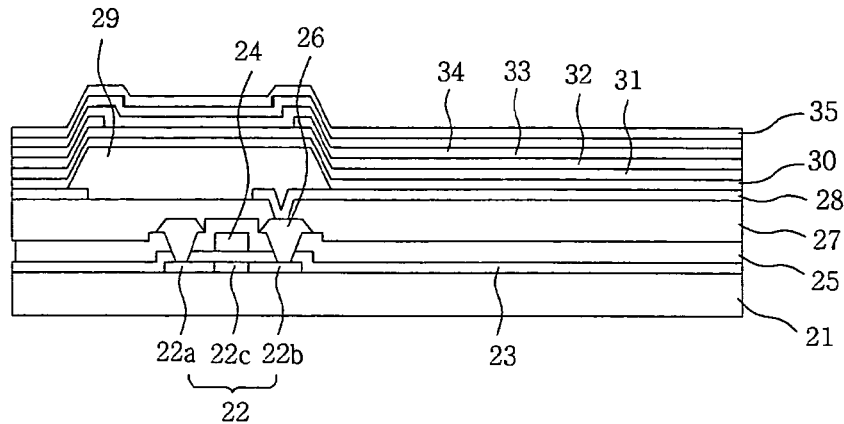

Referring to FIG. 7d, a cathode common electrode 35 is formed on the electron injection layer 34, whereby the cathode common electrode 35 is made by addition of Ag or $Mg_xAg_{1-x}$, in a thickness of 1~5 nm.

Figure 7E:
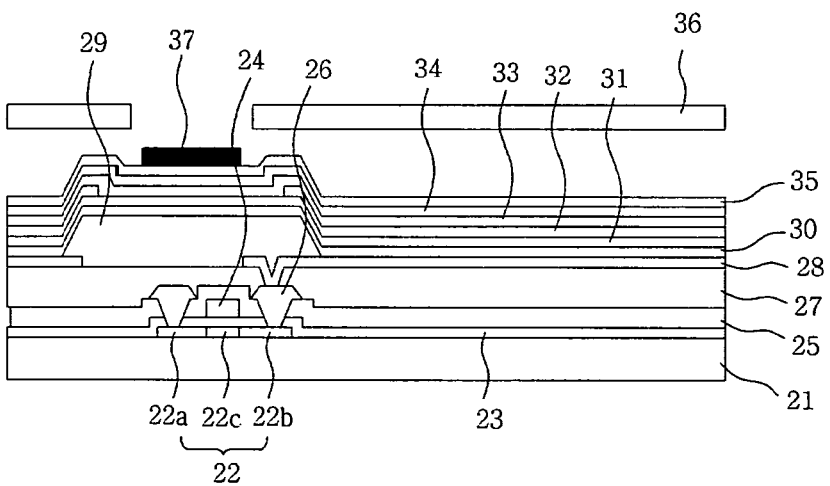

Referring to FIG. 7e, the auxiliary common electrode 37 is formed on areas other than the pixel parts including TFT B utilizing a shadow mask 36 with a stripe pattern through a vacuum affixation process, whereby the auxiliary common electrode 37 is made of a material having a resistance lower than that of the cathode common electrode 35, such as AL, and having a thickness larger than that of the cathode common electrode 35, such as 10~15 nm.

Figure 7F:
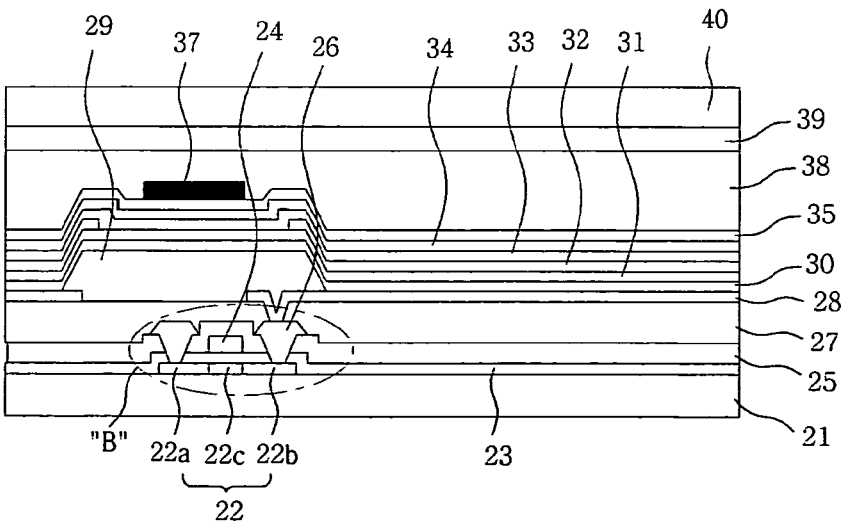

Referring to FIG. 7f a protective film 38 for protection of the R, G, B emitting layers (30 to 34) from oxygen, humidity, etc. is formed and then installed using a sealant 39 and a transparent substrate 40, with which step a an active matrix organic light emitting device in accordance with an embodiment of the present invention is completed.

Here, the R, G, B emitting parts (30 to 34) comprise organic light emitting layers that emit light from organic materials as described above. However, the present invention is not limited thereto, but rather can comprise inorganic light emitting layers that emit light from inorganic materials, as well.

A light emitting panel for mobile phones, computers, HDTV, etc. can be produced using the above light emitting device by combining the same with a circuit board and a control part.

Since the auxiliary common electrode 37 is formed on non-emitting area of the cathode common electrode 35 including the TFT B, opening ratio of the emitting area is not affected thereby, and thus, the transmission rate can be enhanced.

Although the above description refers to one embodiment of the present invention and the accompanying drawings, the present invention is not limited thereto.

Although the auxiliary common electrode 37 is described above to be formed on non-emitting area including TFT or on areas other than pixel area, it can also be formed on light emitting area including organic light emitting layers 32 or on pixel area. In such cases, the organic light emitting layers 32 can be extended to the TFT and the auxiliary common electrode 37 can be formed at the extended edge for the purpose of maximizing the opening rate.

In the above description, the auxiliary common electrode 37 has a thickness larger than that of the cathode common electrode 35. However, thickness of the auxiliary common electrode 37 can also be the same as or even smaller than that of the cathode common electrode 35, i.e. thickness of the auxiliary common electrode 37 can take any value that allows the cathode common electrode 35 to have a minimal thickness and, at the same time, to resist the heat generated by flow of electric current through the cathode common electrode 35.

In the above description, the auxiliary common electrode 37 is made of Al, which has a lower resistance than that of the cathode common electrode 35. However, the auxiliary common electrode 37 can also be made of a material same as that of the cathode common electrode 35. In such case, since the same material is used for both the auxiliary common electrode 37 and the cathode common electrode 35, the cathode common electrode 35 can be formed without use of a shadow mask in the vacuum affixation process, and the auxiliary common electrode 37 can be formed in the same chamber. Accordingly, the manufacturing process can be simplified. As a result, forming the auxiliary common electrode 37 having the same material as that of the cathode common electrode 35 on the cathode common electrode 35 allows for lowering surface resistance. As such, the present invention covers all embodiments or modifications to be implemented cogently or in the future.

Figure 8A:
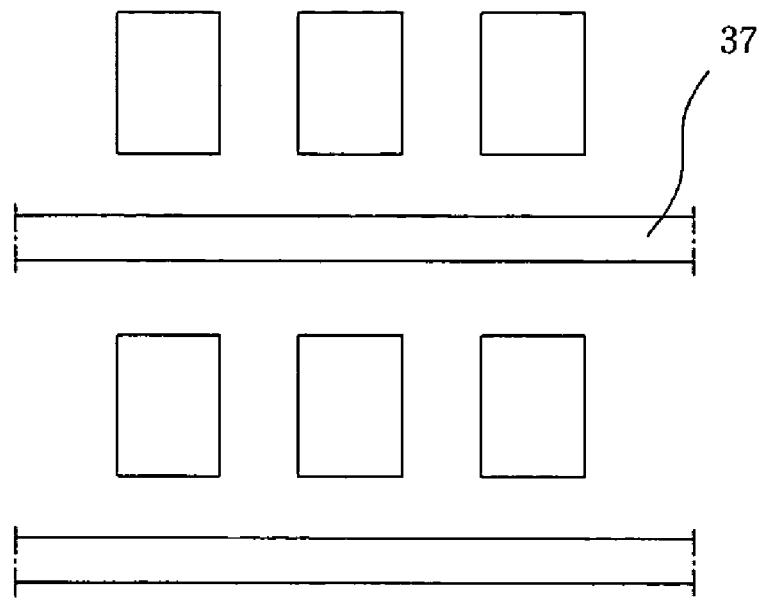
FIGS. 8a and 8b are plane views of light emitting devices in accordance with other embodiments of the present invention.
Figure 8B:
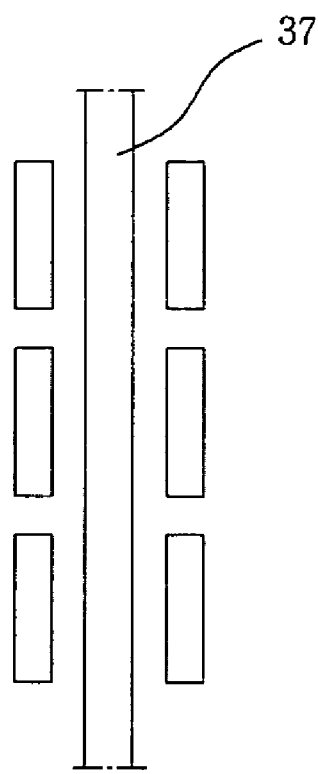

In the above description, the auxiliary common electrode 37 is formed horizontal to R, G, B organic light emitting layers as shown in FIGS. 6 and 8a. However, the auxiliary common electrode 37 can also be formed vertical to R, G, B emitting layers as shown in FIG. 8b. In this latter case, the R, G, B emitting layers shall preferably be formed lengthwise.

The cathode common electrode 35 and the auxiliary common electrode 37 are made of any one of Ag, Al, Au, Cu, Mg, Cr, Mo, LiF, ITO, and IZO, or an alloy of these materials. In particular, the transmission rate can be maximized by forming the cathode common electrode 35 with transparent electrodes such as ITO, IZO, etc. Further, thickness of the cathode common electrode 35 can be minimized at least to 1 nm using LiF and the like.

Although the present invention has been explained above referring to an active matrix organic light emitting device, the present invention can also provide a heat prevention for a top emission type passive matrix organic light emitting device by forming a low resistance auxiliary common electrode at upper part or at lower part of a cathode. Furthermore, the present invention can also provide bottom-emission type active matrix organic light emitting device wherein transparent electrodes such as ITO, IZO, and ITZO are used as anodes 28.

In the above description, a protective film 38, a sealant 39, and a transparent substrate 40 are formed on the cathode common electrode 35 and the auxiliary common electrode 37. However, it is also possible that the protective film 38 is not formed on the cathode common electrode 35 and the auxiliary common electrode 37, and the transparent substrate is attached by a sealant to the glass substrate 21, in which case, a moisture absorbent for removal of humidity and oxygen shall preferably be included inside.

In the above description, an anode 28 is formed on the leveling insulation film 27, a hole injection layer 30 is formed on the anode 28, and a cathode common electrode 35 is formed on the electron injection layer 34. However, it is also possible that a cathode common electrode 35 is formed on the leveling insulation film 27, an electron injection layer 34 is formed on the cathode common electrode 35, and an anode 28 is formed on the hole injection layer 30. In this way, the emitting efficiency can be enhanced at a minimal affection of the opening rate by changing the driving manner or by changing the electrode material while a light emitting device emits light to one or two directions.

The auxiliary common electrode 37 has been described above as being formed at upper part of the cathode common electrode 35 in non emitting area, for simplicity of the explanation. However, the present invention is not limited thereto, but rather, comprises an auxiliary common electrode 37 formed at lower part of the cathode common electrode 35 as well, although such case is not shown in the drawings.

<2. Light Emitting Display>

Figure 9:
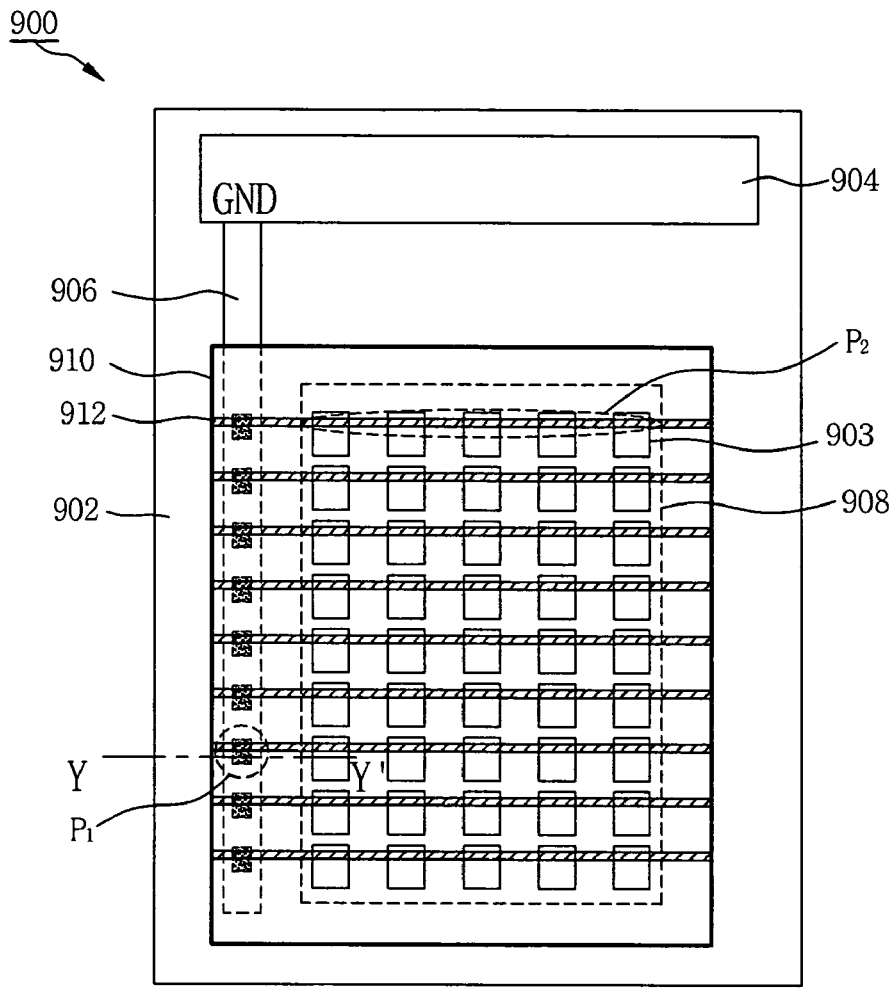
FIG. 9 is a plane view of an organic light emitting display in accordance to an embodiment of the present invention.
Figure 10:
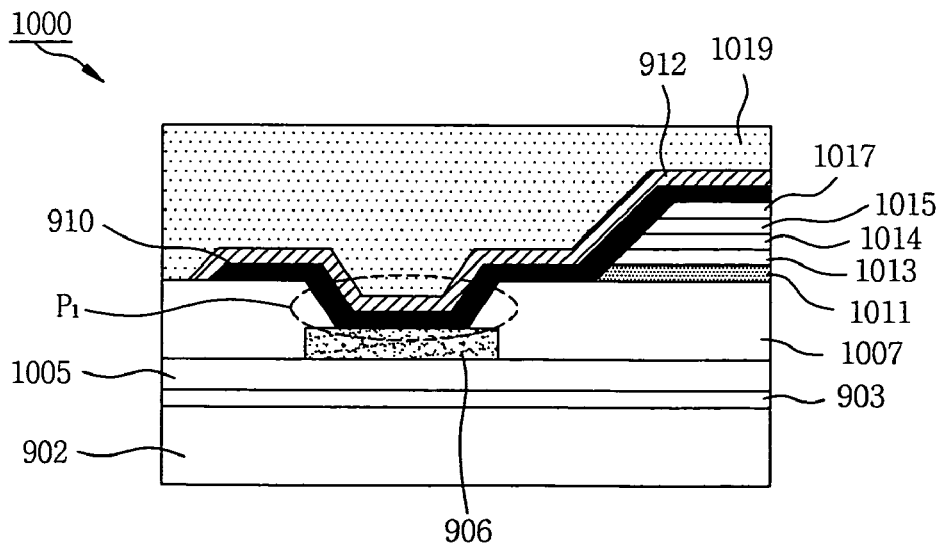
FIG. 10 is a sectional view of the organic light emitting display shown in FIG. 9 taken along area Y~Y'.

On the other hand, FIGS. 9 and 10 show an organic light emitting display in accordance with the present invention which includes a pad part on which organic light emitting devices are formed to be electrically connected to a wiring to drive the organic light emitting devices.

FIG. 9 is a plane view of an organic light emitting display in accordance with an embodiment of the present invention, and FIG. 10 is a sectional view of the organic light emitting display shown in FIG. 9 taken along area Y~Y'.

Firstly, as shown in FIG. 9, an organic light emitting display 900 which is an example of the present invention is defined with a pixel circuit part 908 (not shown) located on a substrate 902 and having a plurality of pixels 903, and a wiring part 906 formed to be electrically connected to a pad part 904 to drive the organic light emitting devices.

In addition, on the wiring part 906 electrically connected to the pad part 904 there is formed a cathode common electrode 910 which is a second electrode to apply voltages to a ground voltage source.

At this time, in the organic light emitting display 900 in accordance to the present invention, an auxiliary common electrode 912 is formed on the upper side of the cathode common electrode 910 so as to be located on the same line as the wiring part 906 exposed through a contact hole P1.

More specifically, as shown in FIG. 10, in the organic light emitting display 1000 in accordance with the present invention, on the substrate 902 is formed a gate insulation film 903 for insulating the gate electrode, and a inter-layer insulation film 1005 for opening a source area (not shown) and a drain area (not shown).

In addition, on the upper side of the inter-layer insulation film 1005 there is formed a leveling insulation film 1007 for leveling the surface. And, the wiring part 906 connects electrically the inter-layer insulation film 1005 to the pad part 904 through the contact hole P1 of the leveling insulation film 1007, and is formed to apply voltages to the ground voltage source.

At this time, the wiring part 906 is formed of either of a gate electrode material or data line electrode material, wherein it is formed of a data line electrode material to apply data signals.

In addition, the cathode common electrode 910, which is a second electrode, is formed to be electrically connected to the wiring part 906 and to cover a hole injection layer 1011, a hole transport layer 1013, a light emitting layer 1014, an electron transport layer 1015, an electron injection layer 1017. And, the auxiliary common electrode 912 is formed on the upper side of the cathode common electrode 910 to be located on the same line as the wiring part 906 exposed through the contact hole P1 of the leveling insulation film 1007 for leveling.

Preferably, the auxiliary common electrode 912 is connected up to the wiring part 906 exposed through the contact hole P1 and formed on the upper side of the cathode common electrode 910, and thus it is formed to reach a non-emitting area P2 of the pixel circuit part 908.

At this time, the cathode common electrode 910 and auxiliary common electrode 912 is formed of any one of Ag, Al, Au, Cu, Mg, Cr, Mo, LiF, ITO, and IZO, or an alloy thereof wherein the material of the auxiliary common electrode 912 is preferably formed of a component having a resistance lower than that of the cathode electrode 910.

Finally, a protective film 1019 is formed on the upper side of the auxiliary common electrode 912 to prevent moisture and oxygen from being penetrated.

As such, in the organic light emitting display 900, 1000 in accordance with the present invention, although a great amount of current flows continuously through the cathode common electrode 910 electrically connected to the wiring part 906 due to the characteristic of the organic light emitting device, the auxiliary common electrode 912 is connected up to the wiring part 906 exposed through the contact hole P1 and formed on the upper side of the cathode electrode 910 to thereby reach the non-emitting area P2 of the pixel circuit part 908, and this allows for lowering surface resistance of the cathode common electrode 910.

Therefore, it is possible to prevent the device from becoming short or oxidized due to heat generated when a great amount of current flows continuously, and thus life span of the device can be extended and reliability of the device can be improved.

On the other hand, the surface resistance of the cathode common electrode electrically contacting the wiring part can be decreased by changing the structure of the auxiliary common electrode of the organic light emitting display in accordance with the present invention.

Figure 11:
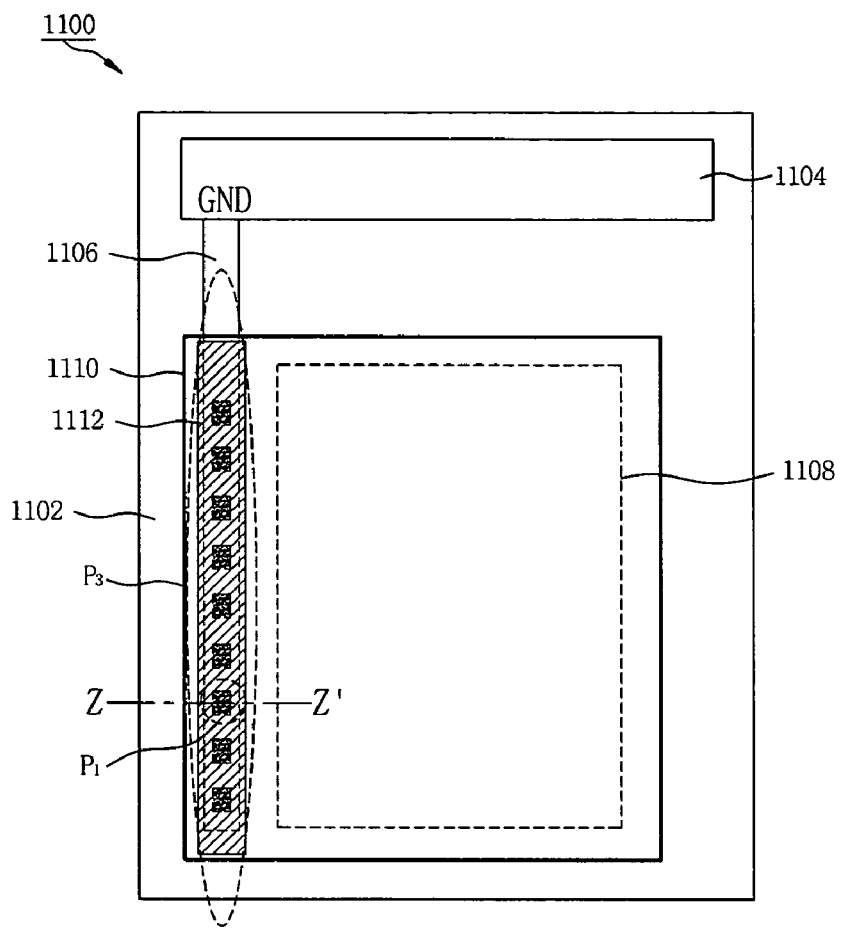
FIG. 11 is a plane view of an organic light emitting display in accordance to another embodiment of the present invention.
Figure 12:
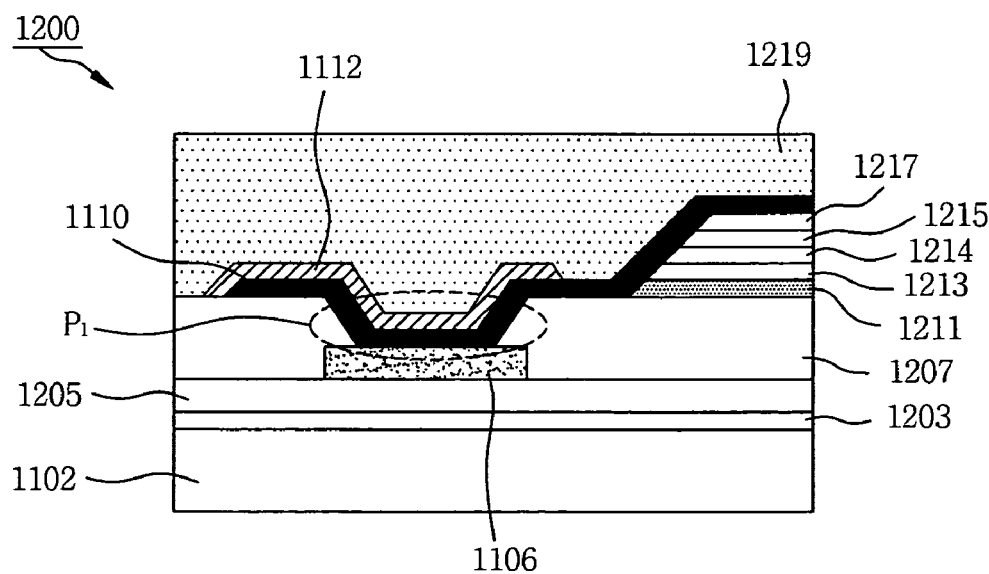
FIG. 12 is a sectional view of the organic light emitting display shown in FIG. 11 taken along area Z~Z'.

FIG. 11 is a plane view of an organic light emitting display in accordance with another embodiment of the present invention, and FIG. 12 is a sectional view of the organic light emitting display shown in FIG. 11 taken along area Z~Z'.

Figure 1:
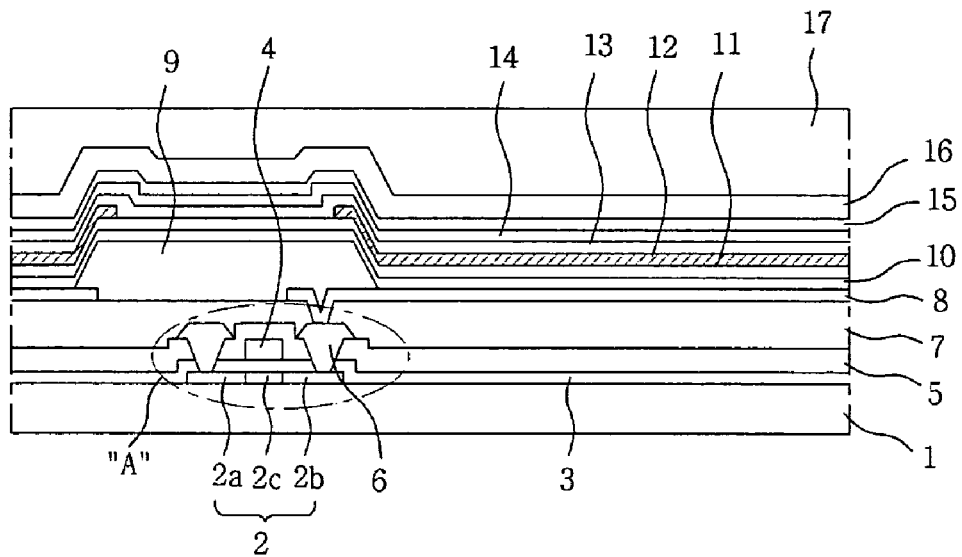
FIG. 1 is a sectional view of a conventional organic light emitting device.
Figure 2A:
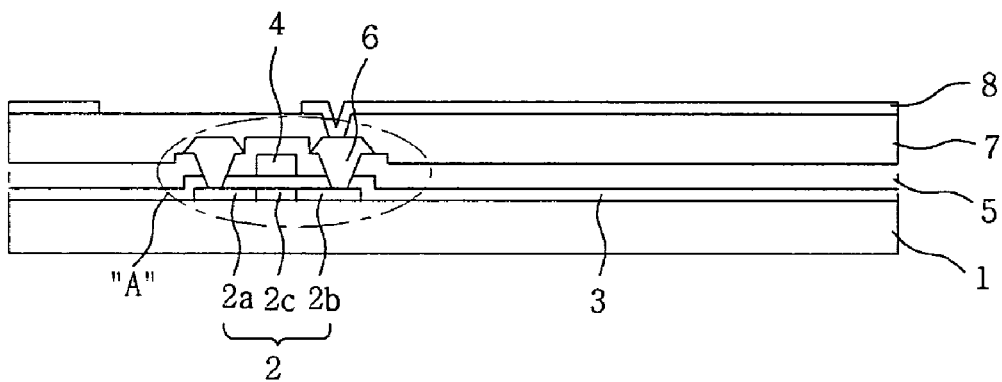
FIGS. 2a to 2d show the process of manufacturing a conventional light emitting device.
Figure 2B:
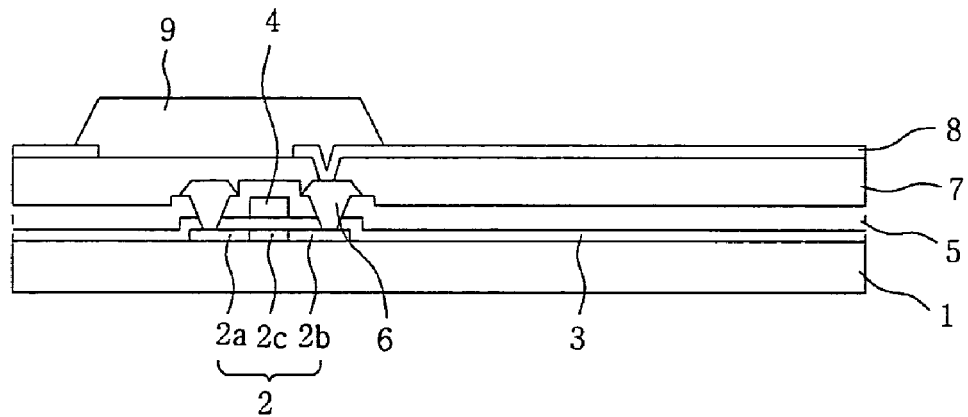
Figure 2C:
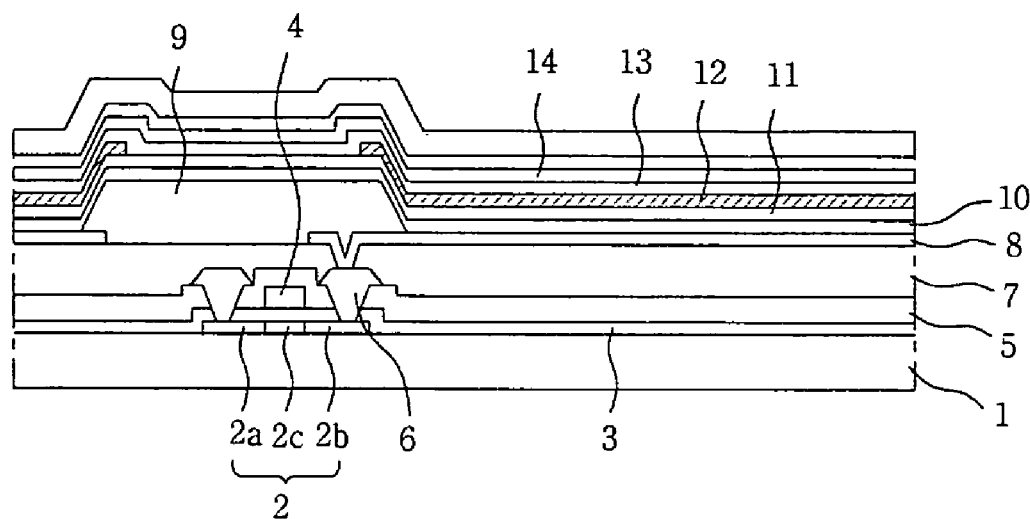
Figure 2D:
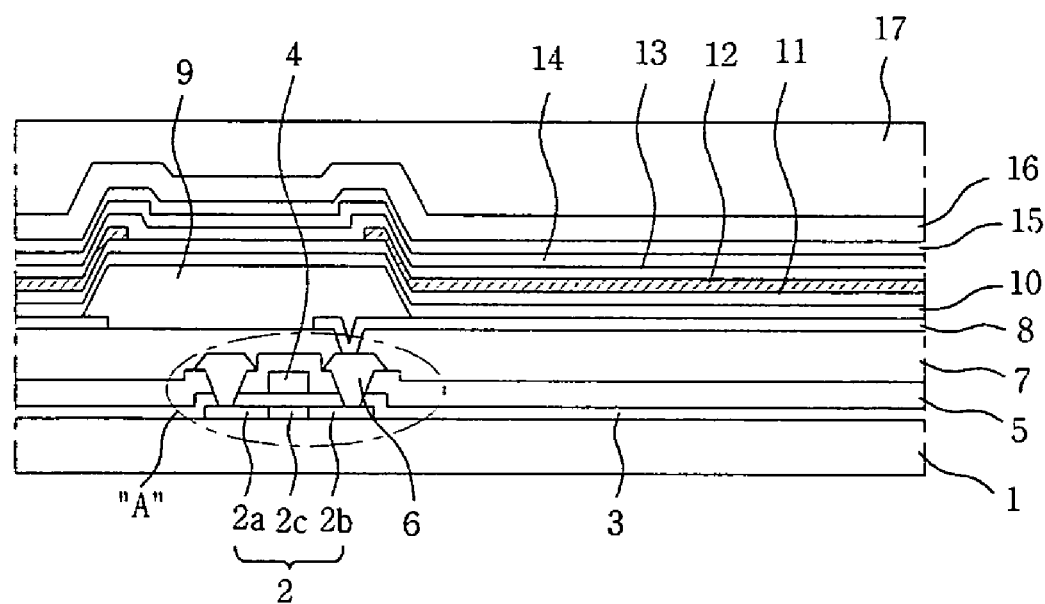
Figure 3:
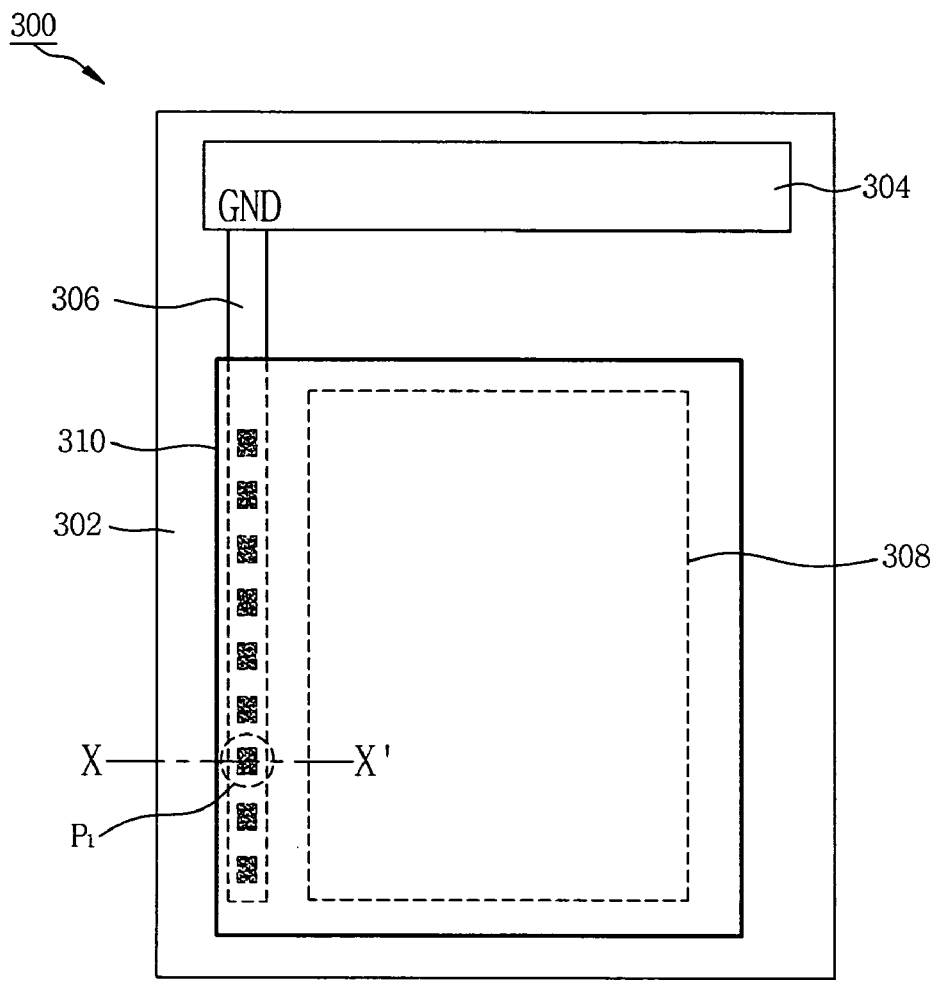
FIG. 3 is a plane view of a conventional organic light emitting device.
Figure 4:
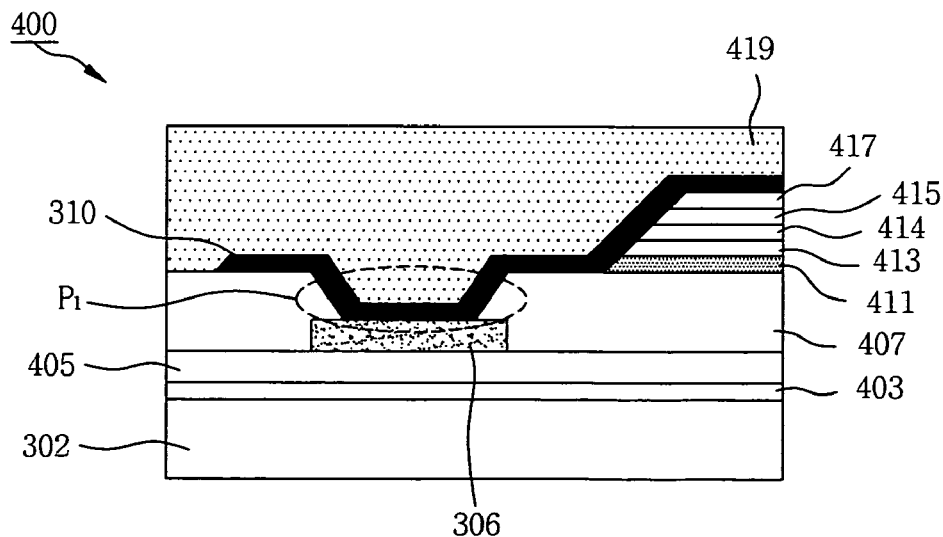
FIG. 4 is a sectional view of the organic light emitting device shown in FIG. 3 taken along area X-X'.

As shown in FIG. 11, an organic light emitting display 1100 in accordance with the present invention comprises a substrate 1102, a pixel circuit part 1108 (not shown) having a plurality of pixels (not shown), a wiring part 1106 formed to be electrically connected to a pad part 1104, and a cathode common electrode 1110 which is a second electrode, similarly to the organic light emitting display (300 of FIG. 3) illustrated above with reference to FIG. 3.

The systemic relation and each operation of components in the organic light emitting display 1110 in accordance with the present invention are similar to those of the organic light emitting display 300 illustrated above with reference to FIG. 3, and thus their detailed description will be omitted.

Here, in the organic light emitting display 1100 in accordance with the present invention, an auxiliary common electrode 1112 corresponds to one or more of contact holes P1 in the longitudinal direction of the wiring part 1106 to be formed on the upper side of the cathode common electrode 1110.

More specifically, in the organic light emitting display 1200 as shown in FIG. 12, on the substrate 1102 is formed a gate insulation film 1203 for insulating the gate electrode, and a inter-layer insulation film 1205 for opening a source area (not shown) and a drain area (not shown). And, a leveling insulation film 1207 is formed on the upper side of the inter-layer insulation film 1205 to flatten the surface, and a wiring part 1106 is formed to apply voltages to a ground voltage source to electrically connect the inter-layer insulation film 1205 to the pad part 1104 through a contact hole P1 of the leveling insulation film 1207. At this time, the wiring part 1106 is formed of either of a gate electrode material or data line electrode material, wherein it is formed of a data line electrode material to apply data signals.

In addition, a cathode common electrode 1110, which is a second electrode to give an electrical connection with the wiring part 1106, is formed to cover a hole injection layer 1211, a hole transport layer 1213, a light emitting layer 1214, an electron transport layer 1215, and an electron injection layer 1217, and an auxiliary common electrode 1112 is formed on the upper side of the cathode electrode 1110 to correspond to one or more of contact holes P1 in the longitudinal direction of the wiring part 1206. Preferably, the auxiliary common electrode 1112 is formed on the upper side of the cathode common electrode 1110 to correspond to the whole area $P_3$ of the wiring part 1206.

At this time, the cathode common electrode 1110 and auxiliary common electrode 1112 is formed of any one of Ag, Al, Au, Cu, Mg, Cr, Mo, LiF, ITO, and IZO, or an alloy thereof, wherein the material of the auxiliary common electrode 1112 is preferably formed of a component having a resistance lower than that of the cathode electrode 1110.

A protective film 1219 to be formed hereinafter is prepared in the same sequential process as that of the protective film 1019 of the organic light emitting display illustrated above with reference to FIG. 10, and the detailed description will be omitted.

As such, in the organic light emitting display 1100, 1200 in accordance with the present invention, although a great amount of current flows continuously through the cathode electrode 1110, which is a common electrode, electrically connected to the wiring part 1206 due to the characteristic of the organic light emitting device similarly to the organic light emitting displays 900, 1000 illustrated above with reference to FIGS. 9 and 10, the auxiliary common electrode 1112 is formed on the upper side of the cathode common electrode 1110 to correspond to the whole area P3 of the wiring part 1206 in the longitudinal direction of the wiring part 1206, and this allows for lowering surface resistance of the cathode common electrode 1110. Therefore, it is possible to prevent the device from becoming short or oxidized due to heat generated when a great amount of current flows continuously, and thus life span of the device can be extended and reliability of the device can be improved.

On the other hand, the surface resistance of the cathode common electrode electrically contacting the wiring part may be further decreased by changing the structure of the auxiliary common electrode of the organic light emitting display in accordance to the present invention, and this will be descried below with reference to FIG. 13, which illustrates another embodiment of the present invention.

Figure 13:
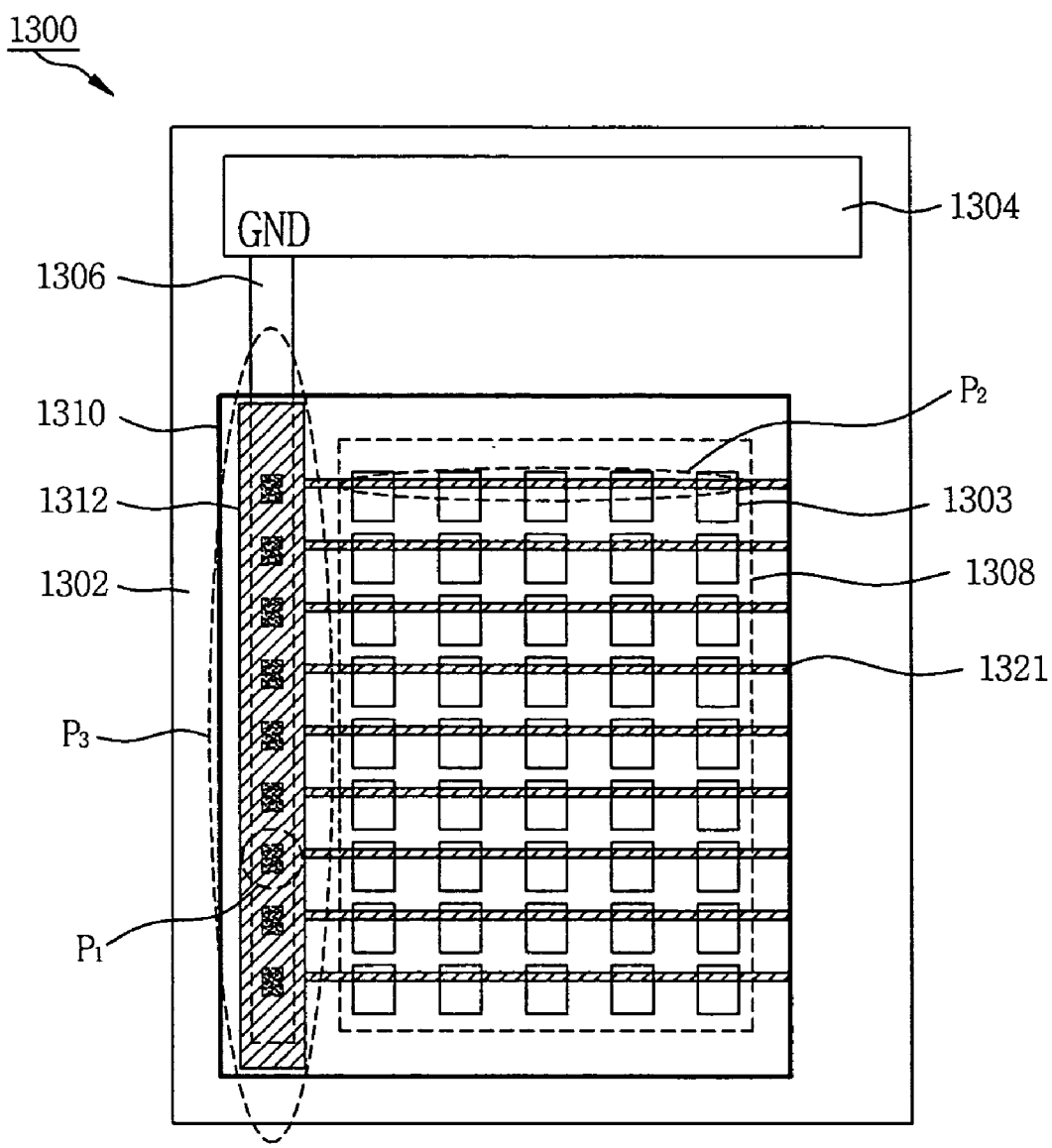
FIG. 13 is a plane view of an organic light emitting display in accordance with still another embodiment of the present invention.

FIG. 13 is a plane view of an organic light emitting display in accordance with another embodiment of the present invention. Firstly, an organic light emitting display in accordance with the present invention is configured similar to the organic light emitting display illustrated above with reference to FIGS. 9 and 11.

As shown in FIG. 13, an organic light emitting display 1300 in accordance with the present invention comprises a substrate 1302, a pixel circuit part 1308 (not shown) having a plurality of pixels 1303, a wiring part 1306 formed to be electrically connected to a pad part 1304, and a cathode common electrode 1310 which is a second electrode, similarly to the organic light emitting display (900 of FIG. 9, 1100 of FIG. 11) illustrated above with reference to FIGS. 9 and 11.

The systemic relation and each operation of components in the organic light emitting display 1300 in accordance with the present invention are similar to those of the organic light emitting displays 900, 1100 illustrated above with reference to FIGS. 9 and 10, and thus their detailed description will be omitted.

Here, in the organic light emitting display 1300 in accordance with the present invention, an auxiliary common electrode 1312 is formed on the upper side of the cathode common electrode 1310 to correspond to the whole area P3 of the wiring part 1306 in the longitudinal direction of the wiring part 1306, and another auxiliary common electrode 1321 is further formed on the upper side of cathode common electrode 1310 to be located on the same line as a contact hole P1, while being connected to the auxiliary common electrode 1312. At this time, the auxiliary common electrode 1321 is formed even on the non-emitting area P2 of the pixel circuit part 1308.

As such, in the organic light emitting display 1300 in accordance with the present invention, although a great amount of current flows continuously through the cathode common electrode 1310 electrically connected to the wiring part 1306 due to the characteristic of the organic light emitting device similarly to the organic light emitting displays 900, 1000, 1100, 1200 illustrated above with reference to FIGS. 9 to 12, the auxiliary common electrode 1312 is formed on the upper side of the cathode electrode 1310 to correspond to the whole area P3 of the wiring part 1306 in the longitudinal direction of the wiring part 1306, and another auxiliary common electrode 1321 is further formed on the upper side of cathode common electrode 1310 to be located on the same line as the contact hole P1, while being connected to the auxiliary common electrode 1312, and this allows for further lowering surface resistance of the cathode common electrode 1310. Therefore, it is possible to prevent the device from becoming short or oxidized due to heat generated when a great amount of current flows continuously, and thus life span of the device can be extended and reliability of the device can be improved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A light emitting device comprising:
a substrate comprising a thin film transistor;
a first electrode formed on the substrate and electrically connected to the thin film transistor;
a light emitting part formed on the first electrode;
a second electrode formed on the light emitting part; and
an auxiliary common electrode formed on a partial area of the second electrode, the partial area including a part of a non-emitting area,
wherein the thickness of the second electrode is less than the thickness of the auxiliary common electrode.

2. The light emitting device of claim 1, further comprising:
an insulation film formed on the first electrode, apart of the insulation film being open between the first electrode and the light emitting part, wherein
the non-emitting area is a area which corresponds to the insulation film except the opened area.

3. The light emitting device of claim 2, wherein
the auxiliary common electrode is formed on an upper side or lower side of the second electrode.

4. The light emitting device of claim 1, wherein
the resistance of the auxiliary common electrode is less than the resistance of the second electrode.

5. The light emitting device of claim 4, further comprising:
a transparent layer formed between the second electrode and the auxiliary common electrode.

6. The light emitting device of claim 5, wherein
the second electrode and the auxiliary common electrode comprise any one of Ag, Al, Au, Cu, Mg, Cr, Mo, LiF, ITO, IZO, or an alloy thereof.

7. The light emitting device of claim 5, further comprising:
a protective film formed on the second electrode and the auxiliary common electrode.

8. The light emitting device of claim 1, wherein
the first electrode and the second electrode are an anode electrode and a cathode common electrode, respectively.

9. The light emitting device of claim 1, wherein
the light emitting part comprises an organic light emitting layer.

* * * * *